(12) United States Patent
Hiraga

(10) Patent No.: US 6,509,617 B2
(45) Date of Patent: Jan. 21, 2003

(54) SEMICONDUCTOR DEVICE AND FABRICATION METHOD THEREOF

(75) Inventor: Noriaki Hiraga, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/933,159

(22) Filed: Aug. 21, 2001

(65) Prior Publication Data

US 2002/0045295 A1 Apr. 18, 2002

(30) Foreign Application Priority Data

Aug. 23, 2000 (JP) ........................................ 2000-252258

(51) Int. Cl.[7] .............................................. H01L 29/76
(52) U.S. Cl. ........................ 257/409; 438/140; 257/401; 257/355
(58) Field of Search .................................. 257/355, 409

(56) References Cited

U.S. PATENT DOCUMENTS 4,300,061 A * 11/1981 Mihalich et al. ............ 307/297
5,301,084 A * 4/1994 Miller ........................... 361/91
6,097,066 A * 8/2000 Lee et al. ..................... 257/355
6,274,909 B1 * 8/2001 Chang et al. ................ 257/355
6,329,694 B1 * 12/2001 Lee et al. ..................... 257/372

FOREIGN PATENT DOCUMENTS

JP  2000-208706  7/2000

* cited by examiner

Primary Examiner—David Nelms
Assistant Examiner—Thao Le
(74) Attorney, Agent, or Firm—Mattingly, Stanger & Malur, P.C.

(57) ABSTRACT

A semiconductor device according to the present invention includes a first guard ring having conductivity of one of N and P types and a second guard ring formed adjacent to the first guard ring and having conductivity of the other type. The first guard ring is formed by a plurality of land shaped well regions each correspondingly to one cell or a plurality of I/O cells and at least one of the well regions is connected to a first power source line and ay least one of the remaining well regions is connected to a second power source line.

7 Claims, 5 Drawing Sheets

SEMICONDUCTOR DEVICE AND FABRICATION METHOD THEREOF

BACKGROUND OF THE INVENTION

1. Field of the Invention

The present invention relates to a semiconductor device and a fabrication method thereof and, particularly, the present invention relates to a semiconductor device, which can easily utilize a plurality of power source voltages in an application processing stage with respect to a base chip of a LSI such as a gate array LSI, an embedded array LSI, a full customized LSI and easily form protective circuits against ESD (Electrostatic Discharge) and/or EOS (Electrical Over-Stress) and is programmable flexibly correspondingly to an I/O cell assignment, and a fabrication thereof.

2. Description of the Prior Art

It has been usual in a base chip of a LSI, which is virtual in a design stage before a program for forming a specific circuit, etc., is not written, that a core portion and an I/O portion are formed separately. Such base chip or a LSI fabricated on the basis of the base chip by performing an application design therefor generally has a structure shown it FIG. 5. As shown in FIG. 5, which is a plan view of an example of a base chip 1 of a LSI or the LSI fabricated on the basis of the base chip 1, various functional circuits, which are usually logic circuits, are formed in the core portion. In the I/O portion thereof, a protective circuit against ESD and/or EOS, etc., is provided in order to protect the semiconductor device against external electrical stress such as electrostatically induced voltage or over-current.

In FIG. 5, the base chip 1 of such as a gate array LSI, an embedded array LSI or a full customized LSI, etc., includes an I/O portion 2 formed in a periphery of the base chip 1, the core portion 3 provided within the I/O portion 2 and a guard ring 4 of a dummy collector, which is formed between the I/O portion 2 and the core portion 3. The dummy collector functions as a collector of a parasitic transistor formed with a substrate of transistors of a CMOS circuit, which are formed in the I/O portion 2 and the core portion 3.

A plurality of I/O cells 5 formed in the I/O portion 2 are used in a power source circuit for a usual power source voltage such as 3V and a plurality of I/O cells 6 also formed in the I/O portion 2 and shown by hatched portions are used in another power source circuit for a 5V power source. A plurality of connector pins 7 are provided in a package or casing 9 of the LSI for external connection.

In the I/O cell portion 2, a plurality of pads 8 are formed correspondingly to the respective I/O cells 5. Although not shown in FIG. 5, a buffer amplifier of the CMOS, an input protective circuit or an output protective circuit, which is constructed with diodes, etc., and a protective circuit against ESD and/or EOS, which is constructed with diodes and capacitors, etc., are usually formed in each of the I/O cells.

In a case where a plurality of power source voltages are utilized in an application process for the base chip, that is, for example, in a case where a 5V power source is used in addition to a usual 3V power source, the I/O cells 6 are selected from the I/O cells 5 as I/O cells for the 5V power source. The LSI using such base chip may be a LSI including an analog signal processor, which is operable with a power source of 5V. In a circuit including a DSP (Digital Signal Processor), the DSP is operated with a power source voltage of about 1.8V.

Incidentally, the guard ring 4 of the dummy collector is provided between the I/O portion 2 and the core portion 3 to separate the former from the latter. It is usual that the guard ring 4 corresponds to a single power source and is connected to a power source line from the single power source to form a protective circuit against ESD and/or EOS. Therefore, it is possible to utilize the guard line as a protective circuit for one power source line. However, when a plurality of different power source voltages are to be utilized, it is necessary to separately provide a corresponding number of protective circuits against ESD and/or EOS to the number of the different voltages in corner portions or a dead space of the I/O portion 2 of the base chip.

Each such protective circuit is formed in the I/O cell 6 of the I/O portion 2. When a 3V power source is mainly used, the I/O cell 6 is usually utilized for a voltage higher than 3V, for example, 5V. Assuming that a region 3a of the core portion 3 is an area of a circuit operable with a 3V power source, a circuit operable with a 5V power source is formed in a region 3b thereof. An area of the region 3b is usually about 10% of the whole area of the LSI.

In the base chip of the LSI, which has the above mentioned structure, the respective I/O cells correspond to the connector pints of the package, respectively. Therefore, if a corner portion or a dead space of the base chip 1 is utilized for the I/O cells, positions of the pins 7 in the package used are limited.

That is, since it is general that the power source pins corresponding to different power source voltages are predominantly selected, the I/O cells 6 utilizing the corner portion or the dead space have to be connected by means of a lead wiring independent from the selected power source pins 7. In such case, when the power source voltage is high, the number of protective elements or the area of the protective element must be increased correspondingly to the power source voltage.

Therefore, it becomes necessary to perform a wiring design, a pin assignment and a selection of I/O cell for every application, resulting in that the number of fabrication steps of a practical LSI is increased.

In order to solve this problem, it has been usual that a plurality of ring-like power source lines and a plurality of ring-like ground lines are provided in the I/O portion 2 correspondingly to a plurality of power source voltages and the protective circuits against ESD and/or EOS formed in the respective I/O cells are connected between the respective power source lines and the ground lines. In such case, however, a line width of each power source line is reduced, resulting in another problem that an enough number of protective elements of the power source system can not be arranged correspondingly to the power source voltages.

In order to solve the above problem, JP H12-208706A assigned to the assignee of this application discloses a technique in which wide power supply line and wide ground line are provided in parallel in an I/O portion and a core portion, respectively, and protective circuits against ESD and/or EOS are formed in the I/O portion and the core portion, respectively.

In such case, however, an area of the core portion is limited and it is necessary to perform a layout design for every one of different power source systems. With such scheme, the number of fabrication steps in a stage of application processing is increased.

SUMMARY OF THE INVENTION

An object of the present invention is to provide a semiconductor device, which is suitable for a formation of a circuit corresponding to an application utilizing a plurality of power source voltages, is programmable flexibly correspondingly to an I/O cell assignment and can be protected against ESD and/or EOS.

Another object of the present invention is to provide a fabrication method of a semiconductor device, which can easily utilize a plurality of power source voltages in an application processing stage and is programmable flexibly correspondingly to an I/O cell assignment and can be protected against ESD and/or EOS.

In order to achieve the above objects, a semiconductor device according to the present invention includes an I/O region having a plurality of I/O cells, a core region surrounded by the I/O region and having various functional circuits and a guard ring provided between the I/O region and the core region. The guard ring is composed of a first guard ring having conductivity of one of P and N types and a second guard ring having conductivity of the other of P and N types and formed adjacent to the first guard ring. The first guard ring is composed of a plurality of land shaped well regions provided correspondingly to respective the I/O cells or to respective I/O cell groups each including a plurality of the I/O cells. At least one of the land shaped well regions is connected to a first power source line and at least one of the remaining well regions is connected to a second power source line.

A method for fabricating a semiconductor device, according to the present invention, resides in that a connection of at least one of the land shaped well regions to a first power source line and a connection of at least one of the remaining well regions to a second power source line are performed in a contact processing or a processing subsequent thereto in a fabrication of a LSI.

In the semiconductor device of the present invention having a construction mentioned above, the first guard ring is- divided to a plurality of the land shaped well regions each corresponding to one I/O cell or to a plurality of I/O cells so that it is possible to selectively connect the land shaped well region to the I/O cell or cells.

This selective connection can be performed in a processing in an application level on the way of a fabrication of the semiconductor device. That is, the selective connection can be performed in a contact processing or a processing subsequent thereto in a fabrication of a LSI, correspondingly to pin positions of different power source voltages. By selecting positions of I/O cells corresponding to positions of power source pins having different voltages and the divided land shaped regions of the first guard ring and by connecting the I/O cells to the land shaped regions, the divided land regions can be utilized as protective circuits for ESD and/or EOS correspondingly to the respective power source voltages. Further, by merely connecting a plurality of land regions in parallel correspondingly to a required current, it is possible to independently form protective circuits for such as diodes having required currents corresponding to the different power source voltages.

In concrete, the selection and connection of the divided well regions of the first guard ring are possible by simply performing a processing of connection wiring in a metal wiring layer in an upper portion of the guard ring, without requiring any special layout design.

As a result, it is possible to easily realize a semiconductor device, which can utilize a plurality of power source voltages in the stage of application processing, is flexibly programmable correspondingly to the I/O cell assignment and can be protected against ESD and/or EOS.

DETAILED DESCRIPTION OF THE PREFERRED EMBODIMENTS

Figure 1:
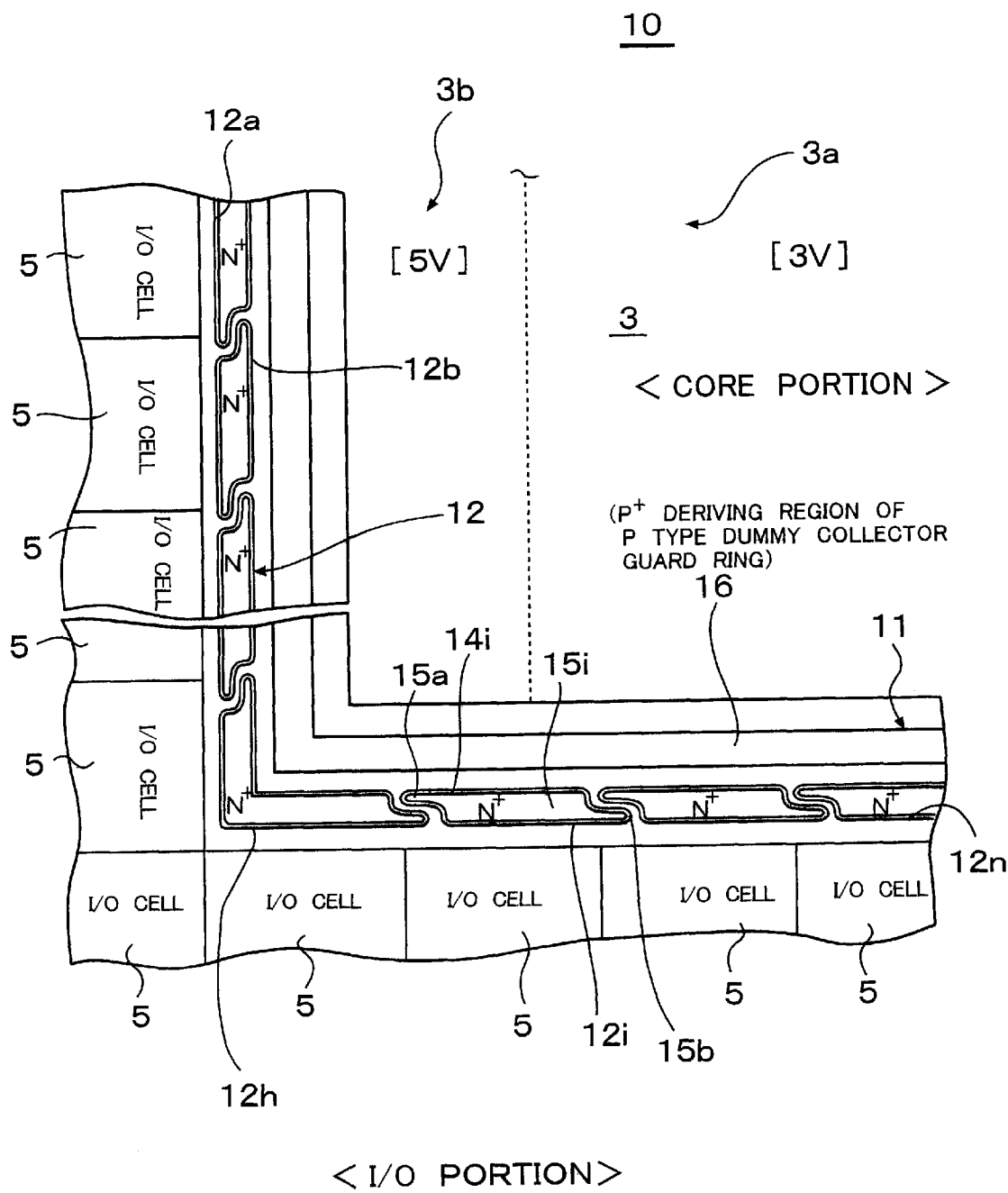
FIG. 1 is a partially enlarged view of a construction of a semiconductor device according to the present invention.
Figure 5:
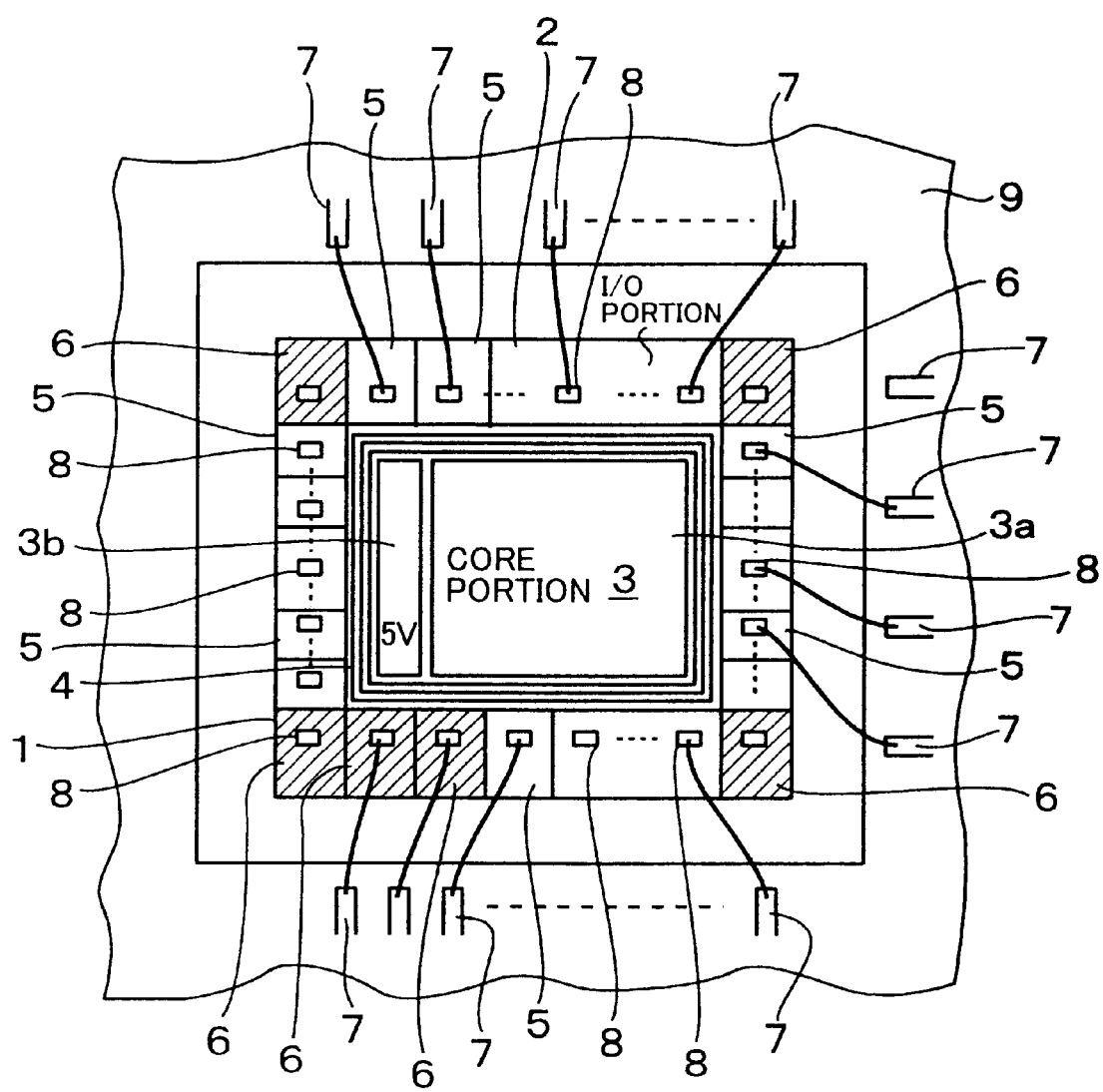
FIG. 5 shows an example of a conventional LSI or a base chip thereof, which includes a core portion and an I/O portion formed separately from the core portion.

In FIG. 1, a corner portion of a LSI 10 such as a gate array LSI, an embedded array LSI or a fully customized LSI, etc., or a base chip thereof, which corresponds to a lower left corner portion of a conventional LSI shown in FIG. 5, is shown in an enlarged scale. A first guard ring 12 is composed of a plurality of land shaped well regions 12a, 12b, . . . , 12i, . . . , 12n, each having a region for deriving an N⁺layer formed between an I/O portion 2 and a core portion 3. The well regions are arranged in the LSI 10 or the base chip thereof with a predetermined interval so that the well regions form a square or rectangular ring such as the guard ring 4 shown in FIG. 5. Further, as shown by the land region 12i in FIG. 1, each land region includes opposite end portions 15a and 15b adapted to be fitted to respective end portions 15b and 15a of adjacent regions on both side thereof.

A deriving region 16 (see FIG. 2) for a P⁺layer having a similar ring shape is provided inside (the side of the core portion 3) the guard ring 12 with a predetermined gap therebetween. With the ring shaped deriving region 16, a second guard ring 11 adjacent to the guard ring 12 is provided along the deriving region 16 of the P⁺layer in a surface of a P type substrate (P-sub) 13.

The second guard ring 11 is formed as a region of a portion of the P type substrate (P-sub) between the guard ring 12 and the core portion 3. The first guard ring 12 and the second guard ring 11 constitute dummy collectors of parasitic transistors formed in relation to the substrate 13, respectively. Incidentally, a number of CMOS circuits are formed in the I/O portion 2 and the core portion 3, respectively.

In the embodiments to be described, constituting elements which are the same as those used in FIG. 5 are depicted by the same reference numerals without detailed description thereof.

As shown in FIG. 1, among the land regions 12a, 12b, . . . , 12i, . . . , 12n of the guard ring 12 arranged in the rectangular shape, the land regions 12a, 12b and 12n corresponding in length to the I/O cells 5 outside them are formed in I/O cell unit, respectively. Further, the land region in the corner portion, for example, the region 12h, corresponds in length to two I/O cell 5. The land region is formed in single I/O cell unit or in plural I/O cell unit.

In the following description, the land region 12i will be described as a representative of others.

Figure 2:
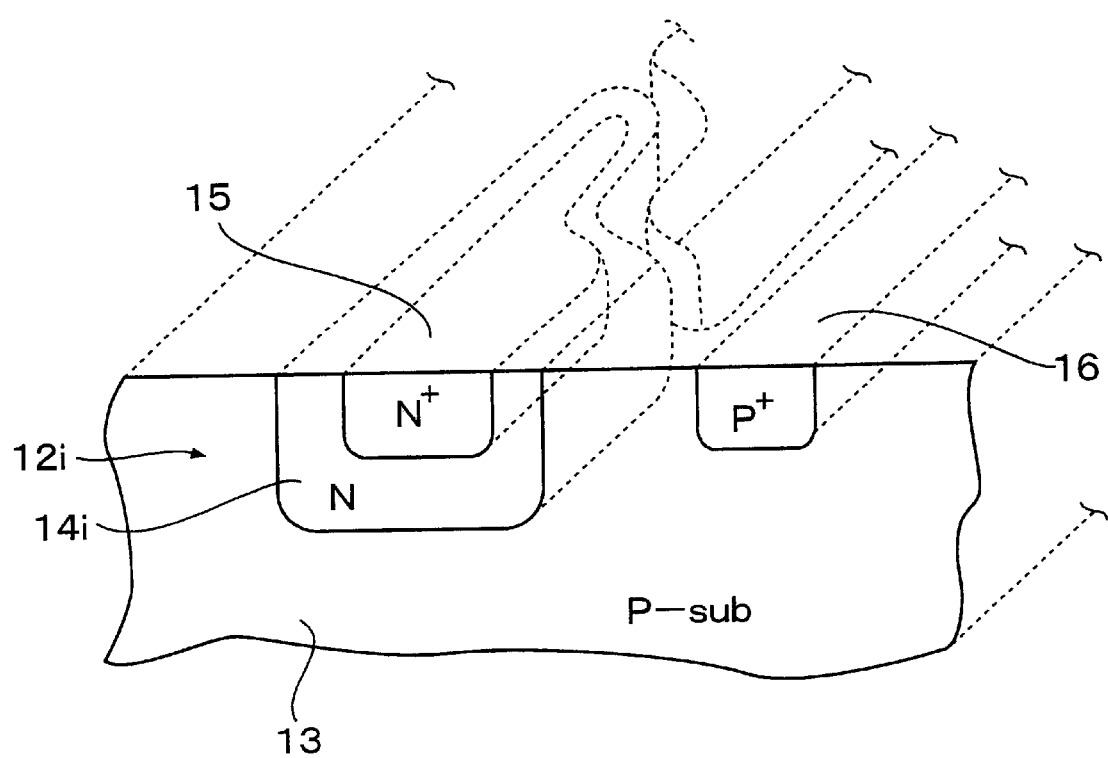
FIG. 2 is a partially cross-sectioned view of a structure of a first guard ring portion.

As shown in FIG. 2, the land region 12i includes a land shaped N type well region 14i corresponding in length to a unit I/O cell or to a plurality of I/O cells and an N⁺layer 15i provided on the surface side of the N well region 14i as the deriving region therefor.

As also shown in FIG. 2, a P⁺layer 16 adjacent to the N well region 14i forming the guard ring 12 with a predetermined gap thereto is formed as a deriving region of the P type guard ring 11. As mentioned previously, the guard ring 11 is formed in the region, which is between the N well region 14$i$ and the P$^+$layer 16 and is outside the latter. The P type guard ring 11 extends to cover spaces between adjacent land regions.

Figure 3:
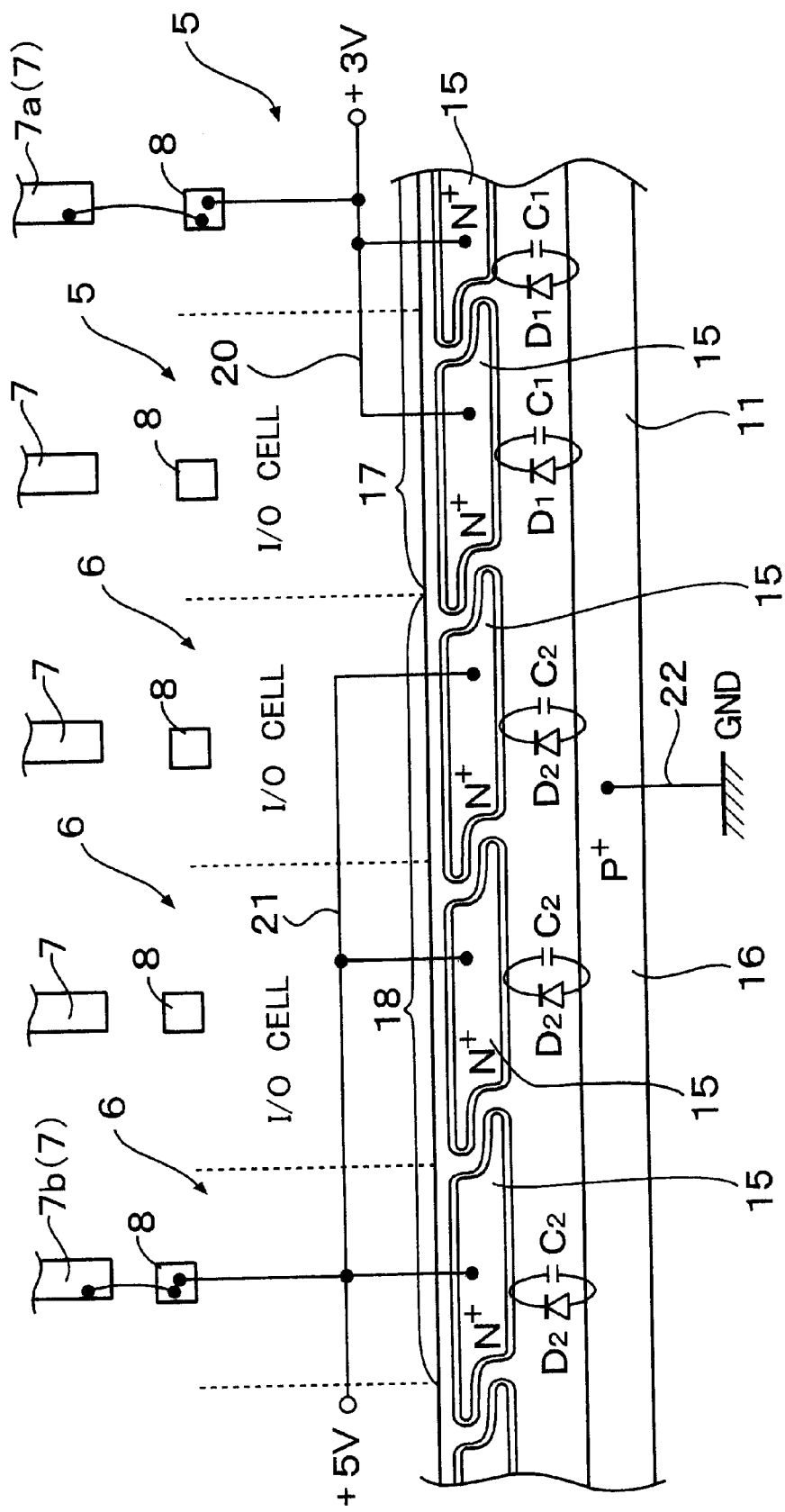
FIG. 3 shows a connecting state of a guard ring area corresponding to a power source voltage.

When there are power source pins connected to a power source of 3V and power source pins connected to a power source of 5V as shown in FIG. 3, a plurality of adjacent N$^+$layers 15$i$ corresponding to the power source of 3V are connected to the power source of 3V through a wiring line 20 formed as an upper layer portion of a metal wiring layer and a plurality of adjacent N$^+$layers 15$i$ corresponding to the power source of 5V are connected to the power source of 5V through a wiring line 21 formed as the upper layer portion of the metal wiring layer. Further, the P$^+$layer 16, which is the deriving region of the guard ring 11 of the dummy collector is connected to ground potential GND through a metal wiring line 22. With such wiring, it is possible to selectively form a guard ring area 17 corresponding to the power source voltage of 3V and a guard ring area 18 corresponding to the power source voltage of 5V correspondingly to respective positions of the I/O cells 5 and 6 corresponding to the power source voltage pins 7$a$ and 7$b$. simultaneously therewith, it is possible to form protective circuits for diodes.

That is, since PN junctions are formed correspondingly to divided well regions between the guard ring 11 of the dummy collector and the N well regions 14$i$ of the respective land regions 12$i$, respectively, these PN junctions become the protective diodes. Further, as shown in FIG. 3, these PN junctions simultaneously form capacitors. Advantageously, it is possible to set protective currents of the protective diodes correspondingly to the number of selected land regions 12$i$ and to increase capacitances of the capacitors. Therefore, it is possible to provide the protective diodes having current capacities corresponding to the high power source voltage.

Further, since, in this case, a P type region is formed between adjacent land shaped N well regions 14$i$, parasitic NPN transistors are formed. These parasitic NPN transistors work as the protective circuits.

In FIG. 3, the wiring line 20 is connected to the power source pin 7$a$ through a pad 8 of the I/O cell 5 in a position corresponding to the power source pin 7$a$ for supplying a voltage of 3V to the base chip 10 and to the N$^+$later 15$i$ of the N well region 14$i$ corresponding to the I/O cell 5. Further, the wiring line 20 is also connected to the N$^+$layers 15$i$ of a plurality of N well regions 14$i$ adjacent to the N$^+$layer 15$i$ of this N well region 14$i$.

The wiring line 21 is connected to the power source pin 7$b$ through a pad 8 of the I/O cell 6 in a position corresponding to the power source pin 7$b$ for supplying a voltage of 3V to the base chip 10 and to the N$^+$later 15$i$ of the N well region 14$i$ corresponding to the I/O cell 5. Further, the wiring line 21 is also connected to the N$^+$layers 15$i$ of a plurality of N well regions 14$i$ adjacent to the N$^+$layer 15$i$ of this N well region 14$i$.

The connections of the wiring lines 20, 21 and 22 formed in the upper layer of the metal wiring layer may be performed in the application level on the way of fabrication of a semiconductor integrated circuit fabricated according to the base chip 10 or in the design step of the base chip 10. As a result, it is enough to simply perform a selective wiring connection correspondingly to the power source pins, without performing a layout design in a contact processing in the fabrication step of a LSI or in a fabrication process subsequent thereto. Particularly, for high power voltage pins, it is enough to obtain a required current or a required area by connecting a plurality of adjacent land regions 12$i$ in parallel. Thus, it is possible to form protective circuits corresponding to the power source voltages.

As a result, as shown in FIG. 3, a diode D1 and a capacitor C1 form each of the protective circuits for the power source voltage of 3V and a diode D2 and a capacitor C2 form each of the protective circuits for the power source voltage of 5V.

As described, it is possible to form the protective circuits correspondingly to the respective power source voltages and correspondingly to the positions of the respective I/O cells. For the I/O cell assigned to the high power source voltage, it is possible to assign a larger area thereto to thereby increase the current of the protective circuits formed by a plurality of diodes D2 and the capacitance of the protective circuits formed by a plurality of capacitors C2. Therefore, it is possible to protect against ESD and/or EOS correspondingly to the power source voltage. Incidentally, in the corner portion shown in FIG. 1, a single land region 12$h$ is formed for the two I/O cells 5, as an example.

Figure 4:
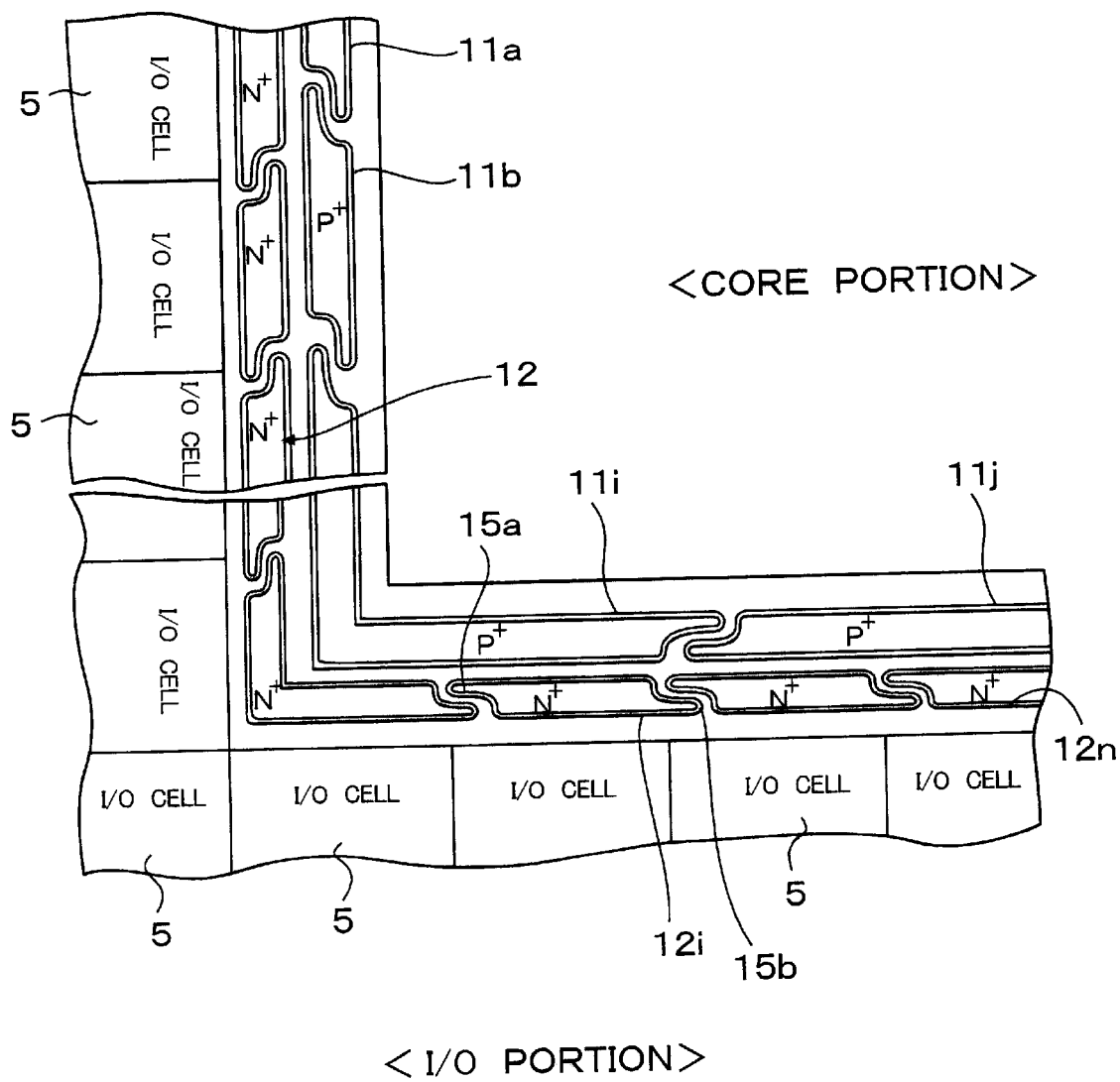
FIG. 4 shows a second guard ring, which is divided.

FIG. 4 shows an embodiment in which a guard ring 11 is divided to a plurality of land shaped P type well regions 11$a$, 11$b$, ..., 11$i$, 11$j$, ..., 11$n$ which have P$^+$type deriving regions correspondingly to the land regions 12$a$, 12$b$, ..., 12$n$ of the guard ring 12. By also dividing the second guard ring 11 in this manner, it is possible to select one or more of the land regions 11$a$, ... 11$i$. ..., 11$n$ of the guard ring 11 corresponding to the different power source voltages, similarly to the respective land regions 12$i$. Therefore, it is possible to ground them separately. For example, it is possible to separate the ground GND for a circuit of digital signal system from that for a circuit of analog signal system. In the latter case, it is possible to separate the ground GND for the device from that for a specific circuit thereof.

Further, it is possible to form protective diodes independently by selecting one or more of the land regions 11$a$, 11$b$, ..., 11$i$, 11$j$, ..., 11$n$ of the guard ring 11, which are divided correspondingly to the respective N$^+$layers 15$i$, as a region or regions to be grounded.

In such case, by connecting the protective diodes formed by the land regions 12$i$ and the land regions 11$i$ corresponding to the respective land regions 12$i$, respectively, in parallel on demand, it is possible to utilize the protective diodes as a protective diode having large current capacity.

The structure of the land shaped P type well region 11 is the same as that of the N type well region 14$i$ shown in FIG. 2, except the conductivity type. For example, the P type well region is formed in a surface of a P type substrate (P-sub) 13 adjacent to the N well region 14$i$ such that an N type burying layer is used as a bottom surface thereof and is surrounded by an insulating region and a land shaped P$^+$deriving region 16 is formed therein.

Although only a portion of the guard ring composed of the divided land regions is shown in FIG. 1, there is no need of connecting all of the land regions of the rectangular guard ring to specific power source lines of different voltages. Further, among the I/O cells 5 or the I/O cells 6 provided in the I/O region 2, there may be an I/O cell or cells in which the protective circuit is not formed.

In the described embodiments, the I/O cell 5 and the I/O cell 6 corresponding to the positions of the respective power source pins 7$a$ and 7$b$ are selected and the land shaped well regions corresponding to the positions of the I/O cells 5 and 6 are connected to the power source pins 7$a$ and 7$b$ through the power source lines 20 and 21, respectively. However, the positions of the power source pins 7$a$ and 7$b$ are not always necessary to correspond to the positions of the well regions to which the power source pins are connected. Incidentally, it is preferable that at least one of land regions, which are connected to a power source pin 7a or 7b through a power source line, is as close to the associated power source pin as possible.

Further, although, in the described embodiments, the guard ring 12 of the N type dummy collector is formed outside the guard ring 11 of the P type dummy collector, it is possible to form the guard ring 12 of the N type dummy collector inside the guard ring 11 of the P type dummy collector.

Further, although, in the described embodiments, the semiconductor substrate is P type, an N type semiconductor substrate can be used as well. In the latter case, the P type well region shown in FIG. 1 is changed to an N type and the N and P type guard rungs shown in FIG. 1 are changed to P and N types, respectively.

What is claimed is:

1. A semiconductor device comprising an I/O region having a plurality of I/O cells, a core region surrounded by said I/O region and having various functional circuits and a guard ring provided between said I/O region and said core region, said guard ring being composed of a first guard ring having conductivity of one of P and N types and a second guard ring having conductivity of the other of P and N types and formed adjacent to said first guard ring, said first guard ring being composed of a plurality of land shaped well regions provided correspondingly to respective said I/O cells or to respective I/O cell groups each including a plurality of said I/O cells, at least one of said land shaped well regions being connected to a first power source line and at least one of the remaining well regions being connected to a second power source line.

2. A semiconductor device as claimed in claim 1, wherein each of said well regions is a dummy collector having a deriving region, said at least one well region is connected to one of said first and second power source lines in a layer above said deriving region through said deriving region.

3. A semiconductor device as claimed in claim 2, wherein each of said well regions is an N type well region formed in a P type substrate, said deriving region is an $N^+$ layer, said second guard ring is formed adjacent to said well regions as a portion of said P type substrate and protective circuits of diodes are formed by said well regions and said second guard ring.

4. A semiconductor device as claimed in claim 3, wherein said second guard ring is a dummy collector having a deriving region in a form of a $P^+$ type layer formed adjacent to said well regions as a rectangular ring, said $P^+$ type layer is connected to a ground line and said well region connected to one of said first and second power source lines is one corresponding in position to said power source pin of said one power source line or adjacent to said one well region.

5. A semiconductor device as claimed in claim 3, wherein a plurality of said well regions are connected to said first power source line through said deriving regions formed as said $N^+$ layer, the remaining well regions are connected to said second power source line through said deriving regions formed as said $N^+$ layer and said second guard ring is formed between said first guard ring and said core region.

6. A semiconductor device as claimed in claim 3, wherein a voltage of said first power source line is higher than a voltage of said second power source line and a circuit operating with the voltage of said first power source line and a circuit operating with the voltage of said second power source line are provided in said core region.

7. A semiconductor device as claimed in claim 2, wherein said second guard ring is composed of a plurality of divided land shaped P type well regions.

\* \* \* \* \*